United States Patent [19]
Schutz

[11] 3,987,370
[45] Oct. 19, 1976

[54] ACTIVE FILTER
[75] Inventor: Alan E. Schutz, Tewksbury, Mass.
[73] Assignee: Frequency Devices, Inc., Haverhill, Mass.
[22] Filed: Feb. 6, 1975
[21] Appl. No.: 547,482

[52] U.S. Cl. .................................. 330/85; 330/107
[51] Int. Cl.² .......................................... H03F 1/36
[58] Field of Search .................... 330/85, 107, 109; 308/167

[56] References Cited
UNITED STATES PATENTS
3,747,007  7/1973  Geitner .......................... 330/107 X
3,760,287  9/1973  Harris .......................... 330/107 UX OTHER PUBLICATIONS
Perea et al., "Filtro Activo De Supresion De Banda Sintonizable De Q Variable," *Revista Telegrafica Electronica*, Mar. 1973, pp. 130, 133.
Girling et al., "Active Filters," *Wireless World*, Mar. 1970, pp. 134–139.
"Multiplier As A Variable Resistor Voltage-Controlled Active Filter," *Electronic Engineering*, Oct. 1972, p. 27.

*Primary Examiner*—James B. Mullins
*Attorney, Agent, or Firm*—Cesari and McKenna

[57] ABSTRACT

An active band-reject filter of the state-variable type is tuneable over a broad frequency range (three decades) while maintaining a substantial notch depth (50–80 db) which is essentially independent of component value or matching. The filter uses active amplifiers in the inverting mode only, to thereby enable use of inexpensive amplifiers which can be feed-forward compensated to increase their open loop gain and bandwidth. Low-pass, band-pass, and high-pass outputs are also provided, with the gain of the bandpass output at the center frequency being essentially flat over three decades of tuning. Provision is made for compensating for non-ideal behavior of both the active (amplifiers) and passive (capacitors) elements.

16 Claims, 8 Drawing Figures

ACTIVE FILTER

BACKGROUND OF THE INVENTION

1. Field of the Invention

The invention relates to active filters and comprises an active band-reject filter of the state-variable type.

2. Prior Art

Active filters are electrical filters containing one or more active elements such as amplifiers. The active elements enable one to obtain the desirable characteristics of RLC filters without using any inductors. The resultant filters are generally smaller, cheaper, and readily adapted to integrated circuit realization. State-variable filters are filters which are designed in accordance with a particular synthesis technique ("state variable synthesis"). These filters are characterized by the use of active integrators and summers connected in a closed loop.

A band-reject filter ideally has zero transmission over a selected band (the "rejection band") and a finite transmission elsewhere. In state-variable filters, the band reject function is typically synthesized by summing the outputs of a low-pass filter and a high-pass filter or by summing the input signal with the output of a band-pass filter. In the former method, peaking effects require one to limit the gain within the filter to avoid overloading or saturating the active elements; this necessitates an increase in the gain of the summing elements which causes an increase in the output noise. This is especially a problem when the filter Q is high. In the latter method, only a limited number of filter circuits are available which provide the necessary unity gain in the band-pass filter output at the band-reject center frequency. Of these, the circuit most suited to broadband tuning requires the use of non-inverting, as well as the inverting, inputs of one or more of the active amplifier elements in the filter. The use of the non-inverting input restricts the use of compensation techniques which can improve the gain-bandwidth response, and thus the performance of the circuit is limited by the non-inverting amplifier. To improve circuit response, therefore, one must utilize a high quality amplifier, and this is quite expensive.

A further limitation on filter circuits is imposed by the non-ideal nature of filter circuit elements, such as finite amplifier loop gain at d.c. frequency, frequency dependent amplifier amplitude variations and phase shift characteristics, and the existence of resistance in capacitors. These factors can seriously degrade circuit performance.

SUMMARY OF THE INVENTION

Objects of the Invention

Accordingly, it is an object of the invention to provide an improved band-reject active filter.

Further, it is an object of the invention to provide an improved band-reject active filter of the state-variable type.

Still a further object of the invention is to provide an improved tuneable band-reject active filter.

Another object of the invention is to provide a band-reject active filter of the state-variable type which is tuneable over a frequency range of several decades while maintaining a substantial notch depth which is relatively invarient to tuning.

Still another object of the invention is to provide a band-reject active filter which is tuneable over a broad frequency range with relative component insensitivity while maintaining substantial notch depth and which additionally provides a low-pass, band-pass and high-pass outputs.

Yet another object of the invention is to provide compensation for the non-ideal behavior of filter circuit elements.

BREIF DESCRIPTION OF THE INVENTION

In the present invention, a band-reject filter is obtained by summing the output of a band-pass filter with the input signal itself. In contrast to prior band-reject filters, however, the summer is incorporated directly in the state-variable filter section. Thus, the output of the band-pass filter section is applied to the high-pass filter section through the summer and not directly, as was previously the case. Further, the output of the summer is fed back to the inverting input of the high-pass section. This arrangement provides the necessary unity gain in the band-pass filter section at the band-reject center frequency. Further, it provides a notch depth proportional to $Q_p/Q_z$, where $Q_p$ and $Q_z$ are the Q's of the poles and zeros of the voltage transfer function. Using commonly available components, $Q_p$ is adjustable from 0.5 to 100, while $Q_z$ can be made greater than 10,000; this provides a theoretical notch depth in excess of −80db. Actually, the notch depth is limited by the gain of the active amplifiers to roughly −80db.

The circuit uses only the inverting inputs of each of the active amplifiers; the non-inverting inputs are grounded. Thus, a low-cost amplifier of limited performance such as the Signetics LM301A can be feed-forward compensated to achieve gain bandwidth products equivalent to more costly amplifiers such as the 701 and then used in the filter in their place. This results in a filter of excellent performance at substantially reduced cost.

Various compensation arrangements are utilized to further improve the filter performance. In one arrangement, the high frequency performance of the filter is improved by capacitively shunting the input resistance of the high-pass filter amplifier at high frequencies to thereby increase the driving signal applied to it from the low-pass filter output. In another arrangement, feed-forward compensation between the output of the band-pass filter and the input of the high pass filter is used to thereby by-pass part of the bandpass output around the summer; this is in the nature of positive feedback. A combination of the two is especially useful when the filter is to be tuned over a broad frequency range (e.g. from 20 Hz to 20 kHz) at a high Q (e.g., Q = 50) while maintaining a substantial notch depth (e.g., −50 db or better).

The filter of the present invention particularly lends itself to voltage tuning. This is readily accomplished by inserting analog multipliers in series between the high-pass and band-pass filters and the band-pass and low-pass filters, respectively, and applying to the multipliers a control voltage whose magnitude is related to the desired band-reject center frequency. Using this technique, a frequency tuning range of from 20:1 can be obtained with a multiplier whose control voltage varies from 0.5 to 10 volts.

An alternative method of setting the band-reject center frequency is to use switches in place of the multiplie and periodically close these switches at a preselected rate. the band-reject center frequency is directly related to the duty cycle of the switch closure.

The filter also is suited to conductance array tuning. In this mode, resistors of various magnitudes are connected between the high-pass and band-pass filter sections and between the band-pass and low-pass filter sections, respectively. The magnitude of the parallel combination of these resistors sets the center frequency.

DETAILED DESCRIPTION OF THE INVENTION

The foregoing and other and further objects and features of the invention will be more readily understood from the following detailed description of the invention when taken in conjunction with the accompanying drawings in which.

Figure 1:
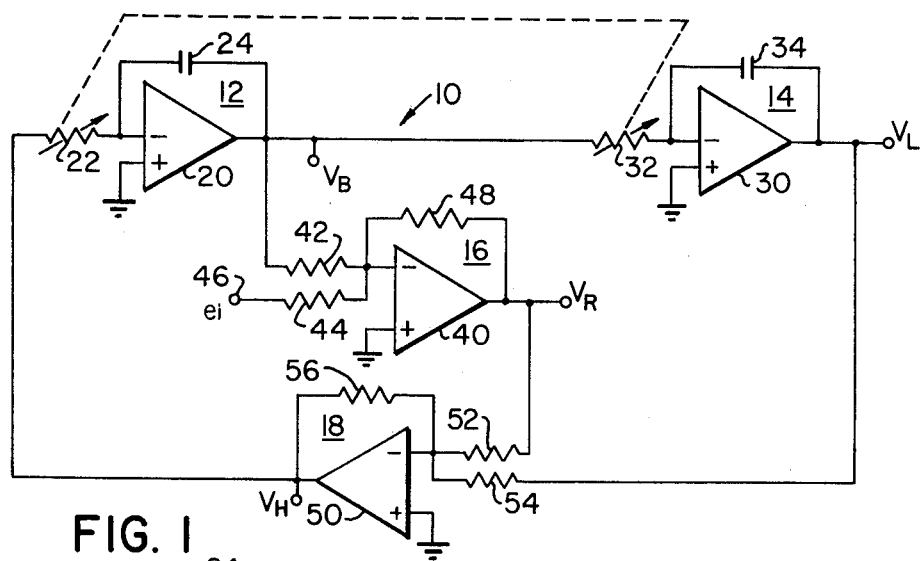
FIG. 1 is a circuit diagram of the band-reject filter of the present invention.

In FIG. 1, a band-reject filter is formed from first and second integrators 12 and 14, respectively, and first and second summers 16 and 18, respectively. The integrators 12 and 14 and summer 18 are connected in series with each other in a first closed ("feedback") loop, while the integrator 12 and summers 16 and 18 are connected in series in a second closed loop.

Integrator 12 is formed from a high-gain, high-input impedance, low output impedance ("operational") amplifier 20 having inverting and non-inverting inputs indicated by a minus and a plus sign, respectively. Typically it, and the other amplifiers of the filter, may comprise a Signetics LM301A feedforward compensated to achieve a gain-bandwidth product of 30 megaherz. A variable resistor 22 is connected in series with the inverting input, and a capacitor 24 is connected for negative feedback between the output of the amplifier 20 and its inverting input; the non-inverting input is connected to ground potential. Similarly, the integrator 14 consists of a high-input impedance, low output impedance amplifier 30 having both inverting and non-inverting inputs, a variable resistor 32 connected in series with the inverting input, and a capacitor 34 connected for negative feedback from the amplifier output to its inverting input; the nn-inverting input is connected to ground potential.

The summer 16 consists of a high-gain, high-input impedance, low-output impedance amplifier 40 having both inverting and non-inverting inputs; a first input resistor 42 connected between the inverting input and the output of integrator 12; a second input resistor 44 connected between the inverting input and a terminal 46 to which an input signal $e_i$ is applied; and a resistor 48 connected for negative feedback from the output of amplifier 40 to its inverting input. Similarly, the summer 18 comprises a high-gain, high-input impedance, low-output impedance amplifier 50 having inverting and non-inverting inputs; a first input resistor 52 connected between its inverting input and the output of summer 16; a second resistor 54 connected between its inverting input and the output of integrator 14; and a feedback resistor 56 connected between the output of amplifier 50 and its inverting input. The non-inverting inputs of summers 16 and 18 are connected to ground potential.

The band-reject function in the filter of the present invention is formed within the second feedback oop comprising integrator 12 and summers 16 and 18; it appears at the output of summer 16. The second loop greatly modifies the characteristics of the underlying filter and provides a band-reject output which is tuneable over a range of at least three decades with excellent rejection in the band-rejection range. In addition, the filter also provides the usual low-pass, band-pass and high-pass functions; these appear as the outputs of the integrators 14 and 12 and the summer 18, respectively, and are denoted as $V_L$, $V_B$, $V_H$, respectively, in FIG. 1.

With the components as identified in FIG. 1, and assuming that the open-loop gain A of each of the amplifiers is much greater than unity, as well as large with respect to any of the impedances associated with the amplifier (assumptions that are quite accurate for amplifiers with gains A of the order of $10^5$ or greater), the expressions for the respective filter functions can be shown to be as follows:

$$\frac{V_L}{e_i} = \frac{a_1}{\tau^2 s^2 + \frac{\tau}{Q_p} s + 1} \quad (1)$$

$$\frac{V_B}{e_i} = \frac{-a_1 T_2 s}{\tau^2 s^2 + \frac{\tau}{Q_p} s + 1} \quad (2)$$

$$\frac{V_H}{e_i} = \frac{a_1 T_1 T_2 s^2}{\tau^2 s^2 + \frac{\tau}{Q_p} s + 1} \quad (3)$$

$$\frac{V_R}{e_i} = - \frac{R48}{R44} \frac{\tau^2 s^2 + \frac{\tau}{Q_z} s + 1}{\tau s^2 + \frac{\tau}{Q_p} s + 1} \quad (4)$$

Where:

$$a_1 = \frac{R48\ R54}{R44\ R52} \quad (5)$$

$$\tau^2 = \frac{R54\ T_1 T_2}{R56} \quad (6)$$

7. $T_1 = R22\ C24$

8. $T_2 = R32\ C34$ $$Q_p = \frac{R42\ R52}{R48} \sqrt{\frac{T_1}{T_2 R56\ R54}} \quad (9)$$

$$Q_z = \frac{A}{T_1 + T_2} \sqrt{\frac{R56\ T_1 T_2}{R54}} \quad (10)$$

Note that the denominators of each of the transfer functions (1) through (4) are identical; the resonant frequencies of each of these filter functions is thus given by:

$$\omega_r = \frac{1}{\tau} = \sqrt{\frac{R56}{R54\ T_1 T_2}} \quad (11)$$

and the bandwidth by:

$$B_w = \frac{\omega_r}{Q_p} = \frac{R48\ R56}{R42\ R52 T_1} \quad (12)$$

At the resonant frequency, which is also the center of the band-reject range, there is a transmission null; the magnitude of the band-reject transfer function at this frequency is given by:

$$\left|\frac{V_r}{e_i}\right|_{\omega=\omega_r} = \frac{-R48}{R44} \cdot \frac{Q_p}{Q_z} = \frac{-R42\,R52}{R44\,R56}\left(\frac{T_1+T_2}{AT_2}\right) \quad (13)$$

The factor A in the denominator of equation (13) insures a deep notch and, by proper choice of the component size, as illustrated below, provides a notch whose depth is relatively insensitive to notch frequency.

Typical values of circuit parmaters are as follows:

| | |
|---|---|
| R22,R32: 2kΩ – 2MΩ | R48: 20kΩ |
| C1,C2: 004μF | R52: 10kΩ – 200kΩ |
| R42: 20kΩ | R54: 20kΩ |
| R44: 20kΩ | R56: 20kΩ |
| R62: 1MΩ – 10MΩ | A = $10^5$ |

From these equations it may be seen that the notch center frequency is varied by varying R22, R32, or both. If both are varied simultaneously, as indicated in FIG. 1, the quality factor $Q_p$ remains constant during the tuning as seen from equation (9). Conversely, if only R32 is varied, the bandwidth $B_w$ remains constant, as seen from equation (12). Further, if $T_1$ and $T_2$ are even approximately related as (14) $T_1 = kT_2$, $0 < k$  1 then the factor $(I_1 + T_2/AT_2)$ in equation (13) reduces to approximately $1 + k/A$ which is negligible, and thus the notch depth is insensitive to tuning.

Figure 2:
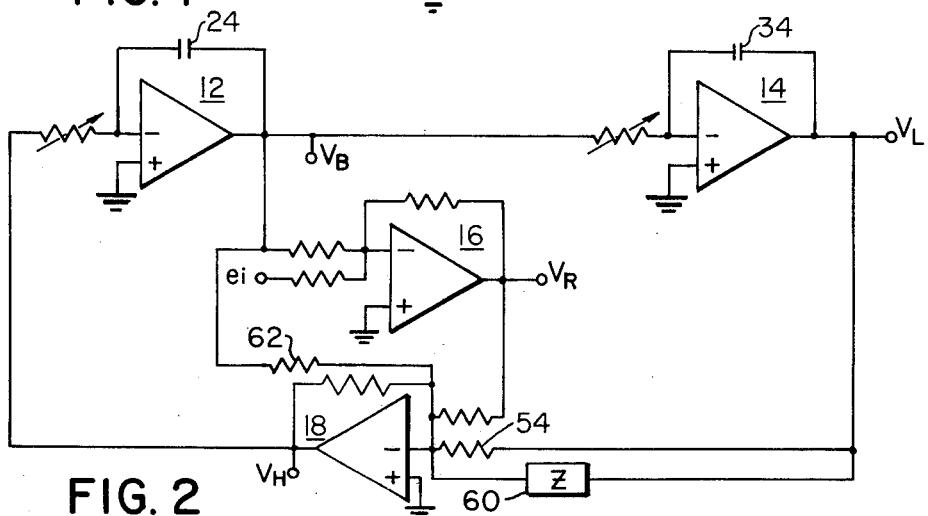
FIG. 2 is a circuit diagram of the filter of FIG. 1 showing certain compensation elements that are used to improve its performance.

The performance of the filters of the present invention can be even further improved by compensating them for non-ideal amplitude and phase characteristics of the active amplifiers and capacitor dissipation characteristics. Preferred forms of compensation are shown in FIGS. 2 and 3. In FIG. 2, an impedance Z is shown connected in parallel with the resistor 54 at the input to summer 18. The impedance Z comprises either a capacitor or a capacitor in series with a resistor. As the input signal frequency increases, the impedance of the capacitor decreases and thus a larger signal is coupled to summer 18 from integrator 14, thereby compensating for decreasing gain in the loop at higher frequencies. The use of a resistor in series with this capacitor limits the rate of change of impedance with frequency introduced by the capacitor alone, and also modifies the phase shift introduced by the compensation.

Further compensation is introduced by means of a resistor 62 which is connected between the output of integrator 12 and the inverting input of summer 18. The resistor 62 provides feedforward from the integrator 12 and the inverting input of summer 18, thereby partially bypassing the summer 16. This feedforward effectively adds a negative resistance to the transmission to thereby cancel the series resistance of the capacitors C24 and D34. The impedance 60 and resistor 62 may be used either separately or together.

Figure 3A:
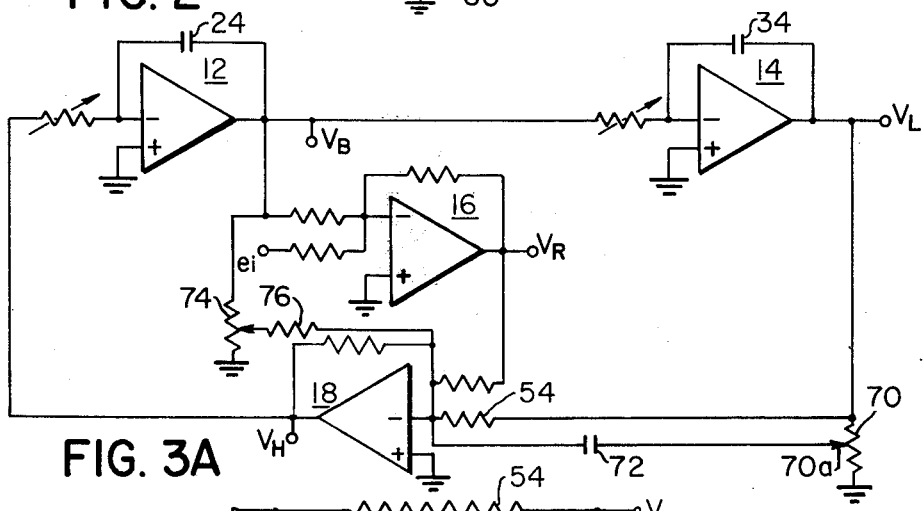
FIG. 3 is a circuit diagram of the filter of FIG. 1 showing further compensation elements for improving the performance of the filter over a wide tuning range.
Figure 3B:
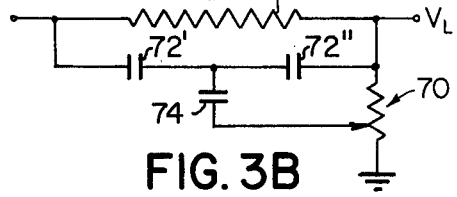

A more general form of compensation technique is shown in FIGS. 3A and 3B. In FIG. 3A, a potentiometer 70 is connected between the output of integrator 14 and ground it has a wiper arm 70a connected to the inverting input of summer 18 through capacitor 72. At low frequencies capacitor 72 has little effect on the input to the summer, but at higher frequencies it provides a leading voltage to amplifier 50 to compensate for the lag in the amplifiers 20, 30 and 50.

Also shown in FIG. 3A is feedforward compensation by means of a potentiometer 74 connected between the output of integrator 12 and ground and having a wiper arm connected to the inverting input of summer 18 by way of a resistor 76. The resistors 74 and 76 function in a manner analagous to the resistor 62 of FIG. 2, that is, they effectively add an adjustable amount of negative resistance to the transfer functions to cancel the effects of series resistance in the capacitors 24 and 34.

FIG. 3B shows a variation of the compensation provided by potentiometer 70 and capacitor 72. As shown in this figure, capacitor 72 is replaced by two separate cpacitors 72; and 72''. When the wiper arm of potentiometer 70 is at its uppermost position, capacitor 72''. When the wiper arm of potentiometer 70 is at its uppermost position, capacitor 72'' is connected directly in parallel with capacitor 74 and the circuit is identical to that of FIG. 3A. When the wiper is at its lowermost position, the capacitors 72', 72'' and 74 and resistor 54 form a bridged T.

Figure 4A:
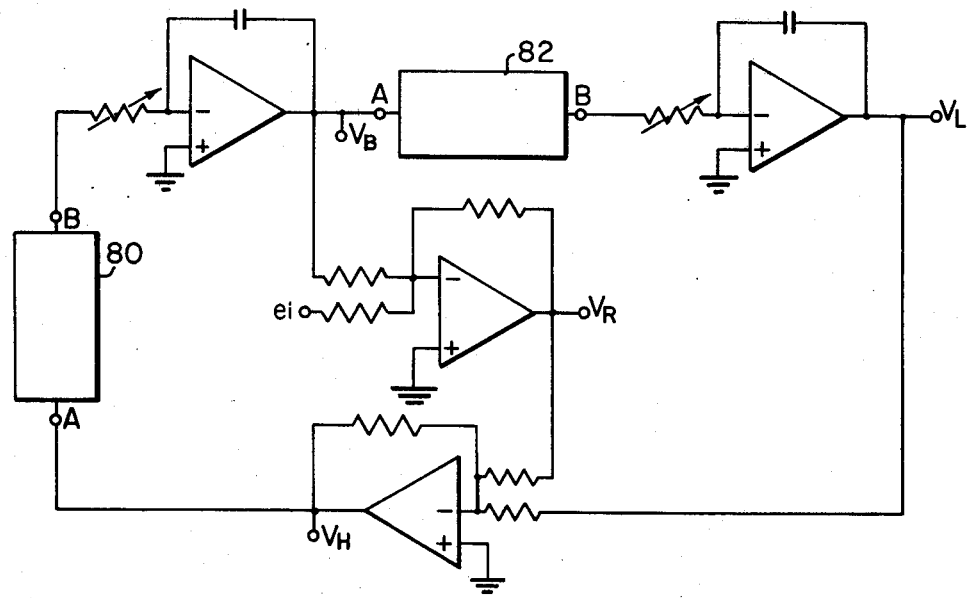
FIG. 4 is a circuit diagram of the filter of FIG. 1 showing various tuning techniques for selecting the rejection-band center frequency.

The filter of FIG. 1, readily lends itself to changing the center frequency by numerous techniques. In addition to changing the resistors 22, 32 of FIG. 1, the center frequency can be varied by voltage tuning, by duty cycle conductance switching, and by conductance array tuning among other methods. These techniques are illustrated in FIGS. 4A–D. In FIG. 4A, the filter of FIG. 1 is shown as including a first frequency-determining element 80 interposed in series between the integrator 12 and the integrator 14. Each of the frequency-determining elements 80 and 82 are identical and, accordingly, only one of them will be described in the following.

Figure 4B:
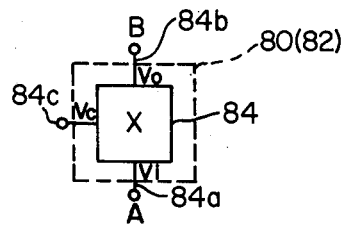

For voltage tuning, the structure of each of the frequency determining elements 80 and 82 is shown in FIG. 4B and comprises an analog multiplier 84 having a filter input terminal 84a, a filter output terminal 84b, and a control voltage input terminal 84c. The voltage $V_o$ appearing at output terminal 84b is given by $V_o = V_c \cdot V_i$ where $V_c$ is the control voltage applied to control terminal 84c and $V_i$ is the filter input voltage applied to terminal 84a. Using a type AD 532 analog multiplier manufactured by Analog Devices, Inc., a tuning range of 20:1 may be obtained from an analog control signal which varies from 0.5 volts to 10 volts, with the frequency given by $\omega r \, V_c/10$ radians per second.

Figure 4C:
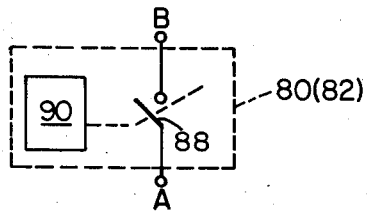

A duty cycle switched conductance tuning arrangement is shown in FIG. 4C in which the frequency-determining elements 80 and 82 each comprise a switch 88 which is periodically opened and closed under control of a timer 90. Preferably a single timer is shared in common by the switching element of tuning controls 80 and 82. The timer may advantageously comprise a multivibrator whose "on" time is adjustable in relation to its "off" time. With this arrangement, the center frequency of the filter is given by:

$$\omega_c = \frac{t_{on}}{t_{on} + t_{off}} \omega_r \quad (14)$$

where $\omega_c$ is the center frequency, $\omega_r$ is the resonant frequency given by equation (11), $t_{on}$ is the time during which the switch 88 is closed, and $t_{off}$ is the time during which the switch 88 is open.

Figure 4D:
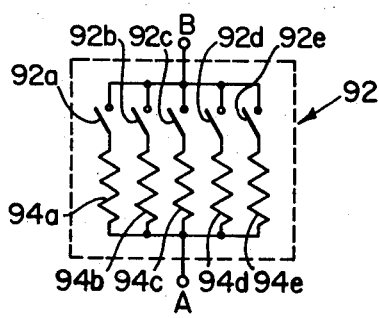

An analogous tuning conrol technique is to switch an entire conductance array and this is shown in FIG. 4D in which the tuning control element 80 comprises a gang of switches 92a – 92e connected in parallel, each switch being connected in series wth a resistor 94a – 94e. By closing selected ones of the switches, the center frequency can be varied in accordance with equations (7), (8) and (11), where now R22 now equals the effective resistance between the input and output terminals of the array, including any resistance in series with the array, and similarly for R32.

From the foregoing it will be seen that there is described an improved band-reject filter that is tuneable over a broad frequency range and that has a deep rejection notch that is relatively invariant with circuit components and notch center frequency. Due to utilization of inverting amplifiers only, the filter is especially adapted to the utilization of inexpensive, active amplifier devices which are compensated to improve their closed loop response. The filter also provides the usual low-pass, band-pass and high-pass outputs, with the band-pass output being essentially constant over the filter tuning range. Further, several schemes for compensating for non-ideal active (amplifier) and passive (capacitor) elements so as to further improve filter performance have been shown.

It will be understood that various changes may be made in the preferred embodiment of the invention set forth herein without departing from either the spirit or the scope of the invention. For example, although the input signal $e_i$ is shown as being applied to amplifier 40, it may be applied to one or more of the amplifiers in the circuit, but the identity and location of the available outputs will also change. Further, tuning can be accomplished with only a single frequency determining element (80 or 82) instead of the two elements shown. Also, other methods of modifying the effective series impedance at the inputs integrators 12 and 14 may be used in place of those shown in FIG. 4. Accordingly, it is intended that the foregoing description should be taken as illustrative only and not in a limiting sense, the scope of the invention being defined in the claims.

I claim:

1. A band-reject filter comprising,
   A. first and second integrators,
   B. first and second summers,
   C. means connecting said integrators in series with each other,
   D. means for applying the output of said first integrator as an input to said first summer
   E. means for applying the outputs of said first summer and said second integrator, respectively, as first and second inputs, respectively, to said second summer,
   F. means for applying the output of said second summer as an input to said first integrator, and
   G. means for applying the signal to be filtered as a further input to said first summer,
   H. each said integrator and summer being formed from an active amplifier having an inverting input and a non-inverting input and having the inputs thereto applied solely to the inverting input thereof.

2. A band-reject filter according to claim 1 in which at least one of said integrators includes a variable resistor for changing the band-rejection center frequency.

3. A band-reject filter according to claim 2 in which said resistor comprises a variable resistor connected in series with the input of said integrator.

4. A band-reject filter according to claim 1 which includes amplifier compensation means comprising a frequency-dependent impedance connected between the output of said second integrator and the input of said second summer and providing a decreasing impedance as said frequency increases, thereby increasing the input to said second summer with increasing frequency.

5. A band-reject filter according to claim 1 which includes compensation means comprising an impedance connected between the output of said first integrator and the input of said second summer to thereby feed at least a portion of the signal from said integrator directly to said second summer without passage thereof through said first summer.

6. A band-reject filter according to claim 1 which includes filter compensation means comprising a voltage divider connected between the first integrator output and ground and having a tap connected to provide at least a portion of the voltage appearing across the divider as an input to said second summer.

7. A band-reject filter according to claim 6 in which said voltage divider comprises a potentiometer having a wiper arm forming said tap.

8. A band-reject filter according to claim 1 which includes filter compensation means comprising a first capacitor connected between the input of said second summer and a tap on a voltage divider connected between the output of said second integrator and ground, said capacitor thereby applying to said summer a frequency-dependent portion of the voltage appearing across said divider.

9. A band-reject filter according to claim 8 in which said voltage divider comprises a potentiometer having a wiper arm forming said tap.

10. A band-reject filter according to claim 8 which includes second and third capacitors connected in series between the output of said second integrator and the input of said second summer, and in which said first capacitor is connected to said summer input via the junction between said second and third capcitors.

11. A band-reject filter according to claim 1 which includes means for varying the center frequency of the rejection band of said filter, means comprising
   1. at least one analog multiplier connected to receive as a first input thereto the output of one of said summer and integrators,
   2. connected to receive as a second input thereto a reference signal indicative of a selected band-reject center frequency,
   3. connected to apply to as input to one of said integrators a tuning signal proportional to the product of said first and second inputs.

12. A band-reject filter according to claim 1 which includes means for varying the center frequency of the rejection band, said means comprising:
   1. a switch connected in series with at least one of said integrators, and 2. means for periodically opening and closing said switch, the center frequency of the filter being thereby determined by the duty cycle of said switch.

13. A band-reject filter according to claim 1 which includes means for varying the center frequency of the rejection band of said filter, said means comprising:
1. a resistor bank connected in series with at least one of said integrators and formed from a plurality of resistors in series with a corresponding plurality of individually actuable switches, said resistors being connected in parallel between an input terminal and an output terminal of said resistor bank, and
2. means for selectively actuating said switches to thereby change the effective resistance presented to said integrator by said resistor bank.

14. A band-reject filter comprising:
A. first and second integrators, each including an amplifier connected in the inverting mode only,
B. first and second summers, each including an amplifier connected in the inverting mode only,
C. means connecting the output of said first integrator as an input to said second integrator,
D. means connecting the output of said first integrator as an input to said first summer,
E. means connecting the output of said first summer as a first input to said second summer,
F. means connecting the output of said second summer as an input to said first integrator,
G. means connecting the output of said second integrator as a second input to said second summer, and
H. means connecting a signal to be filtered as a further input to said first summer.

15. A band-reject filter according to claim 14 in which
1. a first of said integrator and both of said summers are connected in series to form a first closed loop
2. a second of said summers and both said integrators are connected in series to form a second closed loop.

16. A band-reject filter according to claim 15 which includes variable impedance means in series with the amplifier of at least one of said integrators for varying the band-reject center frequency.

* * * * *